US 6,664,798 B2

(12) United States Patent
De Jong et al.

(10) Patent No.: US 6,664,798 B2
(45) Date of Patent: Dec. 16, 2003

(54) INTEGRATED CIRCUIT WITH TEST INTERFACE

(75) Inventors: Franciscus Gerardus Maria De Jong, Eindhoven (NL); Rodger Frank Schuttert, Eindhoven (NL); Johannes De Wilde, Eindhoven (NL); Gerrit Willem Den Besten, Eindhoven (NL); Bernardus Martinus Johannes Kup, Eindhoven (NL); Albertus Jan Paulus Maria Van Uden, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/790,419

(22) Filed: Feb. 22, 2001

(65) Prior Publication Data

US 2001/0015653 A1 Aug. 23, 2001

(30) Foreign Application Priority Data

Feb. 23, 2000 (EP) .............................. 00200619

(51) Int. Cl.[7] .............................................. G01R 31/02
(52) U.S. Cl. .................................... 324/763; 324/765
(58) Field of Search ................................. 324/763, 765, 324/522, 523, 538, 555; 714/726, 727, 733, 734

(56) References Cited

U.S. PATENT DOCUMENTS 5,068,604 A   11/1991   Van de Lagemaat ........ 324/158
5,801,536 A * 9/1998   Brambilla et al. .......... 324/522
5,894,224 A   4/1999   De Jong .................... 324/537
5,963,038 A   10/1999  De Jong et al. ............ 324/537

* cited by examiner

Primary Examiner—Kamand Cuneo
Assistant Examiner—Minh N. Tang
(74) Attorney, Agent, or Firm—Aaron Waxler

(57) ABSTRACT

Integrated circuit with a test interface for testing a conductive connection between a supply pad and a supply of a functional block in the integrated circuit. A current test circuit has test inputs coupled to a first and a second point along the conductive connection, for comparing a voltage across the test inputs with a threshold. The current test circuit contains a threshold shifting circuit for shifting the threshold to a shifted value dependent on a voltage across the test inputs when the threshold shifting circuit is active. Testing is executed in two steps, making the threshold shifting circuit active when a first voltage is applied across test inputs and comparing a second voltage at the test input with the shifted threshold. One of the first and second voltage is a voltage drop across the connection when the integrated circuit is set to draw current along a connection, the other one of the first and second voltage is a reference voltage. In an embodiment the integrated circuit has a shunt circuit to provoke current through the conductive connection under test in parallel with current through the functional block.

15 Claims, 2 Drawing Sheets

INTEGRATED CIRCUIT WITH TEST INTERFACE

FIELD OF THE INVENTION

The field of the invention is an integrated circuit with a test interface and a method of testing power supply connections in a circuit that contains such an integrated circuit.

BACKGROUND OF THE INVENTION

To ensure that an integrated circuit will work properly under all conditions, it is desirable to test the IC for faults in the power supply connections. In principle a completely malfunctioning power supply connection can be detected by a lack of response from functional blocks that should receive power from the power supply connection. However, such a test does not cover all possible faults. For example, if the integrated circuit has more than one power supply connection for the same supply voltage, a fault in one connection may be masked because supply current could flow to the functional block from another supply connection. This might allow the functional block to respond under some circumstances, although it is unable to operate adequately in certain situations, for example when it suddenly has to consume an increased supply current.

As an alternative, one may monitor the voltage drop along the power supply connection. But such a test for faulty power supply connections in an integrated circuit is difficult, because no voltage drop other than parasitic voltage drops can be tolerated along power supply connections. U.S. Pat. Nos. 5,894,224 and 5,963,038 describe a technique, which uses coils to detect the current along the power supply connection, but this only works in integrated circuit technologies that allow for incorporation of coils without much parasitic effects.

U.S. Pat. No. 5,068,604 discloses a method of testing the functioning of power supply connections of an integrated circuit that has multiple supply connections for the same power supply voltage. The test uses a measurement of the internal voltage difference in the integrated circuit between the voltage of different nodes that should be connected to different power supply connections for the same supply voltage. The idea is that a current will flow in the integrated circuit between these nodes in case one of the power supply connections is not connected properly. In the connections between such nodes a higher resistance can be tolerated, which results in a measurable voltage drop between the nodes.

Unfortunately, it is not always straightforward to interpret such a voltage drop. For example, if there are three or more connections for the same power supply voltage connected to respective nodes, current might flow between a first and second one of the nodes both when the second node is disconnected from its power supply connection and when a third one of the nodes is disconnected. To resolve the fault, an additional measurement may be needed.

SUMMARY OF THE INVENTION

Amongst others, it is an object of the invention to provide for an integrated circuit and a method of testing power supply connections to integrated circuits wherein a more straightforward test is possible.

The integrated circuit according to the invention has a current test circuit with a threshold shifting circuit for shifting the threshold of the current test circuit into an operating range before comparing a voltage across the test input of the current test circuit with the threshold. The threshold shifting circuit is triggered as integral part of the response to a test command, which is preferably received via a conventional scan chain test interface (as used herein, "scan test" encompasses both internal boundary scan test (aimed at circuit board level testing) and scan test of circuits internal to an integrated circuit). Thus, the threshold is dynamically adjusted as part of execution of the test command. This makes it possible to use highly sensitive current detection.

In an embodiment the integrated circuit according to the invention performs said shifting by applying a predetermined input voltage to the current test circuit and shifting the threshold so that the current test circuit has its threshold set at a level that is at a predetermined difference from the input voltage. In a preferred embodiment the predetermined input voltage is zero. In this way, a desired threshold can be easily controlled. Preferably, the threshold is adjusted in several steps, first bringing it to a level which equals the input voltage when a predetermined reference voltage is present at the test input and then shifting the threshold by a predetermined amount.

Such a current test circuit may be used to test the amount of "surge" current caused by switching on output buffers in the functional block. Output buffers are connected to terminals that constitute relatively large capacitive loads, such as external output pins of the integrated circuit. Charging such a load causes a temporary surge current, which may lead to power supply bounce effects. By using the current along the power supply connection either to shift the threshold or for comparison with the threshold a predetermined time interval after switching on the output buffers, it is possible to judge whether this current may lead to ground bounce effects. Preferably, the integrated circuit contains a timer to control the time between switching on current through the output buffers and its use.

Of course the current test circuit may also be used to perform other tests, such as a test whether the power supply connection actually conducts current. Preferably, to accommodate different kinds of test, the threshold shifting circuit is arranged to offset the threshold of the current test circuits by different selectable predetermined amounts from a voltage across the inputs of the current test circuit when the threshold is shifted.

In another embodiment of the circuit according to the invention a shunt circuit is arranged in parallel with the functional circuit to ensure sufficient current for detection. The shunt circuit is preferably a current source that is switched on to ensure a precise current. The shunt circuit allows for an accurately controlled increase in the supply current through the connection under test during testing, to ensure a sufficiently large voltage drop. The words "shunt circuit" are understood to mean any circuit arranged to draw current in parallel with another circuit. The words shunt circuit should not be understood to be limited to a short circuit, which causes an appreciable voltage drop over the circuit that is shunted by the shunt circuit.

In a further embodiment, the circuit has several supply pads and several shunt circuits, each for specific one of the supply pads. The supply pads are connected in the integrated circuit by a power supply conductor, to which the shunt circuits are also connected. When a test command to test current from one of the supply pads is executed, all shunt circuits may be activated to ensure that current from other supply pads doesn't disturb the test. However, this leads to considerable power dissipation in the integrated circuit. In an embodiment the only activated shunt circuit(s) are the shunt circuits for one or more neighboring power supply pads, that are connected to the power supply conductor nearest to the supply pad under test. Shunt circuits "further on" are kept non-conductive. In an embodiment, current detection circuits for the supply pads corresponding to the other activated shunt circuits are self tested while they are activated for this test.

BRIEF DESCRIPTION OF THE DRAWING

These and other advantageous aspects of the circuit and method according to the invention will be described in more detail using the following figures.

DETAILED DESCRIPTION OF THE PRIMARY EMBODIMENT

Figure 1:
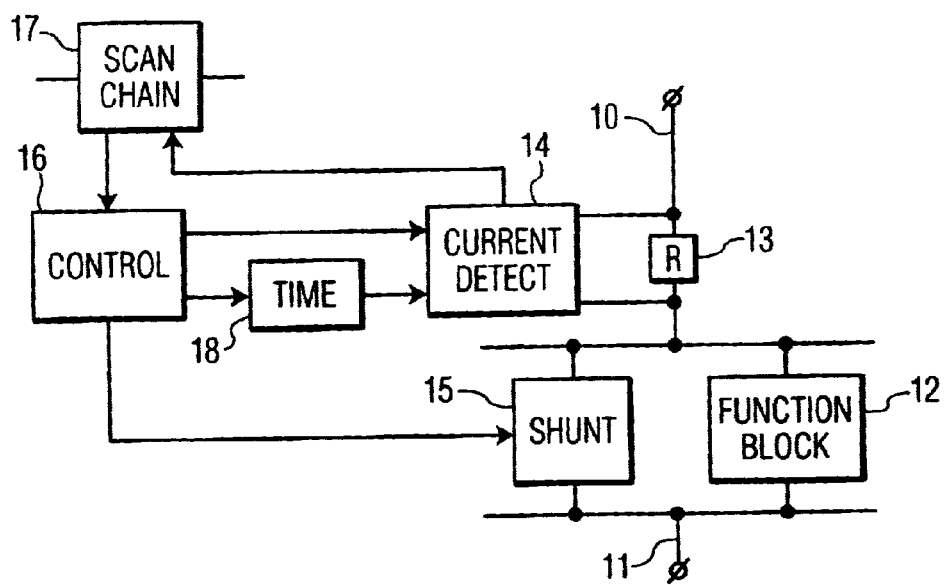
FIG. 1 shows a circuit with a test interface.

FIG. 1 shows a circuit with a first and second supply connection 10, 11, a functional block 12, a supply line resistance 13, a current detection circuit 14 that serves as current test circuit, a shunt circuit 15, a control circuit 16 and a scan chain circuit 17. The power supply connections 10, 11 are connected to the functional block. The current detection circuit 14 is shown connected at two points to a connection between the first power supply connection 10 and the functional block 12. Between these two points the resistance 13 of the connection is shows symbolically as a lumped resistor. In practice, this is a parasitic resistance of the connection itself between the two points, which is very small, for example of the order of 10 milli-Ohm (the whole connection between supply connection 10 and functional block 12 has for example a resistance of 100 milli-Ohm). The length of the connection between the two points may be less than the width of the conductor track that implements the connection. Shunt circuit 15 is connected in parallel with the functional block 12, so as to sink current from the first power supply connection 10 through the resistance 13. Control circuit 16 has control outputs connected to current detection circuit 14 and shunt circuit 15. Scan chain circuit 17 has an output connected to control circuit 16 and an input connected to current detection circuit 14.

In operation the circuit of FIG. 1 is able to operate in a normal mode and in a test mode. In the normal mode functional block 12 performs some circuit function of the circuit, using power supplied from the power supply connections 10, 11. In the test mode, the circuit is controlled from scan chain circuit 17. In the test mode, the circuit checks the correct operation of the connection between the first power supply connection 10 and the function block 12. Basically, this involves switching on shunt circuit 15, so that a substantial current (for example 200 mA, causing a voltage drop over the resistance 13 of the order of 2 milli-Volt) will flow from the first power supply connection 10 through resistor 13 to shunt circuit 15 if the connection is intact. This is controlled from scan chain circuit 17. A control pattern is loaded into scan chain circuit 17, which causes control circuit 16 to command shunt circuit 15 to start conducting current. Subsequently, current detection circuit 14 compares the voltage drop over resistor 13 with a threshold value. The result of this comparison is sampled and loaded into scan chain circuit 17.

Prior to the comparison of the voltage drop with the threshold value control circuit 16 signals the current detection circuit 14 to shift its threshold value into an operating range. The operating range is made up of threshold values that have the property that they are between two possible voltage drops, which correspond to a normal power supply connection and a faulty power supply connection respectively. The shift into the operating range can be done in various ways, for example by equalizing the threshold to a value of the voltage drop which occurs before the control circuit 16 makes shunt circuit 15 conductive and subsequently setting the circuit to a state wherein the threshold is shifted by a predetermined offset relative to the value obtained by said equalizing. Alternatively, the threshold may set by temporarily connecting both inputs of current detection circuit 14 to a common node (rather than to two points on opposite sides across resistor 13), equalizing the threshold to a voltage drop which the current detection circuit 14 senses at its inputs in this case and subsequently switching to a state in which the threshold is shifted by a predetermined amount relative to the value obtained by equalizing.

In a different embodiment, the threshold of detection circuit is shifted when the voltage drop across the resistor 13 reflects the current under test, to a threshold value equal to that voltage drop. Afterwards, the threshold is shifted by a predetermined amount relative to the threshold value obtained in this way. A standard voltage drop is applied to the inputs of detection circuit 14, either by providing a standard current or by switching the inputs to a circuit that provides the standard voltage drop (e.g. zero). The current detection circuit 14 compares this standard voltage drop with the shifted threshold and the result is fed to the scan chain circuit 17.

Preferably, control circuit 16 commands the current detection circuit 14 to sample a result of current detection within a predetermined time-interval after shifting the threshold into the operating range. A timer 18 may be used to control this time interval. Thus, the result is sampled independent of the point in time when the scan chain circuit 17 samples the output (but of course before that point in time is allowed). This sampling restricts the effect of threshold drift that may occur after shifting the threshold.

The current detection circuit 14 may be used to asses the size of a current surge a predetermined time interval after switching on output buffers (not shown) in the functional block 12. Output buffers are connected for example to external output pins or to bus lines in the integrated circuit. If assessment of the size of the current surge is desired, the control circuit 16 is also coupled to the output buffers e.g. to switch on the output buffers directly after the threshold has been shifted, so that timer 18 controls the time between switching on the output buffers and sampling of the test result. Alternatively, the control circuit 16 signals the output buffers to switch on, this signal triggering a timer, which in turn triggers sampling. Of course, the voltage drop during the surge may also be used to shift the threshold, the threshold being compared subsequently with a reference voltage.

Figure 2:
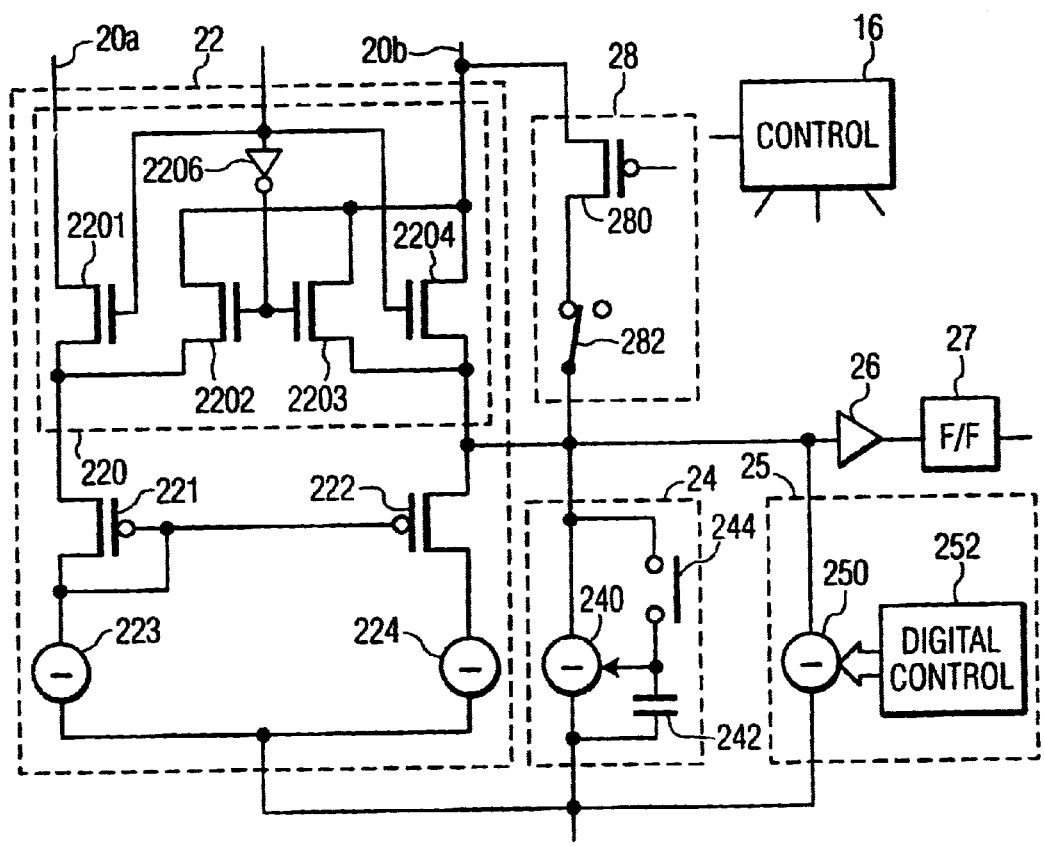
FIG. 2 shows a current detection circuit.

FIG. 2 shows a current detection circuit with a voltage detection circuit arid a switch circuit. The input circuit of FIG. 2 has inputs 20a, 20b, for connection across the resistor 13, the current detection circuit contains a first stage 22, a threshold feedback circuit 24, a threshold offset circuit 25, a comparator 26, a flip-flop 27 and a self test circuit 28.

The first stage contains the switch circuit 220 and two branches (221, 223) and (222, 224) connected between the switch circuit 220 the second power supply connection. The switch circuit 220 contains first, second, third and fourth PMOS switch transistors 2201, 2202, 2203 and 2204 and inverter 2206. The channels of first and second PMOS switch transistor 2201, 2202 are connected between the first branch 221, 223 and a first and second one of the inputs 20*a*,*b* respectively. The channels of third and fourth PMOS switch transistor 2203, 2204 are both connected between the second branch 222, 224 and the second one of the inputs 20*b*. A switch control input of the switch circuit 220 is connected to the gates of the first and third PMOS switch transistor 2201, 2203 via inverter 2206 and to the gates of the second and fourth PMOS switch transistors 2202, 2203.

The first branch contains from its connection to switch circuit 220 in series a main current channel of a first PMOS transistor 221, a first current source 223 and the second power supply connection, which is opposite (different) to the power supply under test. The second branch is contains from its connection to switch circuit 220 in series a second one of the inputs 20*b*, a main current channel of a second PMOS transistor 222 and a second current source 224 the second power supply connection. The switch 220 is also coupled to the second one of the inputs 20*b* and is arranged to connect either the first or the second one of the inputs 20*a*,*b* to the main current channel of the first PMOS transistor 221. The gate of first PMOS transistor 221 is coupled to a node between its main current channel and first current source 223 and to the gate of the second PMOS transistor 222. A node between the main current channel of second PMOS transistor 222 and second current source 224 forms the output of first stage 22.

The threshold feedback circuit 24 contains a controllable current source 240, a capacitor 242 and an adjustment switch 244. The controllable current source 240 is coupled between the output of the first stage 220 and the second power supply connection 11. A control input of controllable current source 240 is coupled to the output of first stage 220 via the adjustment switch 244 and to the second power supply connection 11 via capacitor 242.

The threshold offset circuit 25 contains a further controllable current source 250 and a digital current control circuit 252. The further controllable current source 250 is coupled between the output of the first stage 22 and the second power supply connection 11. Self test circuit 28 contains a series connection of a main current channel of a third PMOS transistor 280 and a self test switch 282; this series connection is connected between the output of the first stage 22 and the second input 20*b* of the current detection circuit.

The output of the first stage 22 is connected to an input of comparator 26, which in turn has an output coupled to a data input of flip-flop 27. A data output of flip-flop 27 forms the output of the current detection circuit. Control circuit 16 (not shown in FIG. 2) has control connections (not shown) connected to switch 220, self test switch 282 adjustment switch 244, digital threshold control circuit 252 and flip-flop 27.

Operation is as follows. In normal test mode switch 220 connects the main current channel of first PMOS transistor 221 to the first input 20*a* via the channel of first PMOS switch transistor 2201. The channel of second PMOS switch transistor 2202 is made non-conductive. The voltage at the gate of PMOS transistors 221, 222 adjusts itself so that first PMOS transistor 221 draws the same current as first current source 223. The gate source voltage of second PMOS transistor 222 differs from that of first PMOS transistor 221 by the amount of voltage drop across the inputs 20*a*,*b*. Thus, the current through second PMOS transistor 222 will depend on the current from first current source 223 and any voltage drop between inputs 20*a*,*b*.

Comparator 26 will output a logic low or high depending on whether this current from second PMOS transistor 222 is larger or smaller than a current supplied by second current source 224, adjustable current source 240 and further adjustable current source 250. The output of comparator 26 is sampled by flip-flop 27 on a signal from control circuit 16.

In the absence of adjustable current source 240, the transistors 221, 222 and current sources 223, 224 should have to be dimensioned so that the current through the second PMOS transistor 222 is exactly equal to the current from second current source 224 when there is no voltage drop across the inputs 20*a*,*b*. However, due to parameter spread caused by such factors as process variations and temperature drift, it will not be possible to do so with sufficient accuracy. This problem is solved with adjustable current source 240.

Before the control circuit 16 signals the flip-flop 27 to sample the output of the comparator 26, the control circuit 16 signals the circuit to adjust its threshold into an operating range. The control circuit 16 sets the threshold offset circuit 25 to a minimum value. Control circuit 16 controls switch 220 so that the main current channel of the first PMOS transistor 221 is connected to the second input 20*b*, via the channel of second PMOS switch transistor 2202. The control circuit 16 makes first PMOS switch transistor 2201 nonconductive and adjustment switch 244 conductive. As a result the voltage at the control input of controllable current source 240 will be adjusted so that current from second PMOS transistor 222 is equal to than a current supplied by second current source 224, adjustable current source 240 and further adjustable current source 250. Thereupon control circuit 16 makes current adjustment switch 244 non-conductive, so that the control voltage of the controllable current source remains fixed. Subsequently, the control circuit 16 selects a different current from threshold offset circuit, to give an offset to the threshold. The change in offset determines the difference between a zero voltage drop and a voltage drop across inputs 20*a*,*b* that will cause comparator 26 to trip.

In a self test mode, the control circuit 16 causes a self test of the current detection circuit by making self test switch 282 conductive. This simulates a current from second PMOS transistor 222 due to a voltage drop. If the comparator 26 responds properly to such a current it is concluded that the circuit functions properly. Normally, the control circuit 16 keeps self test switch 282 non-conductive, so that a sufficient voltage drop is detected only if sufficient current flows through the connection between the first power supply connection 10 and the functional block 12.

Preferably, the control circuit 16 is arranged to be able to set the further controllable current source to different current levels. Thus, the threshold of the current detection circuit can be shifted to a selectable level, to perform different tests, detecting different amounts of currents under different circumstances. For example, the threshold may be set to a first level for testing a steady state voltage drop due to current through the shunt circuit. For testing the size of current surges when a number of output buffers is switched on in the functional circuit the threshold may be set to a second, different level.

Current surges can compromise the reliability integrated circuit operation due to problems like ground bounce. To ensure proper operation of the integrated circuit it is desirable to test integrated circuits to determine whether the current surges are not too large. It is seen as difficult to test circuits for these problems because of their transient nature. To realize such a test, in a test mode the threshold of the detection circuit is first shifted to a level that corresponds to a steady state current with output buffers (not shown) in the functional block 12 switched off. Subsequently, the threshold is shifted by a predetermined amount and one or more output buffers (preferably all or half the output buffers) are switched on, so as to simulate switching that may occur during normal use of the functional block 12. A predetermined time after switching on the output buffers, the output of the detection circuit is sampled, so as to determine whether the current surge in response to the switching on of the output buffers is not too large for reliable operation of the integrated circuit. Of course, a similar test may be provided for sudden drops in current, due to switching off of the output buffers. Although this type of test can be performed with the circuit of FIG. 2, it will be clear that other types of detection circuits with adjustable threshold can also be used for this purpose.

Preferably, control circuit 16 uses a timer 18 to control the time interval between switching on or off of the output buffers and sampling of the result of current detection by the detection circuit 14 after a command is received to perform this type of test. In an embodiment the timer 18 is programmable from the scan chain circuit 17, so that the time interval can be control with commands from the scan chain circuit. Alternatively, timing may be controlled by applying different commands to control circuit 16 with a time interval in between. However, this may be difficult when a very short time interval between switching on the output buffers and sampling of the detector output is needed.

The scan chain circuit 17 may be used to control the selection of the shunt circuit 15 that are activated and to select the tests (no test, self test or real test) and, if necessary, the threshold shift introduced by the further controllable current source 25. To do so, string of binary zero's and ones is shifted into the scan chain circuit 17 and used to control the control circuit 16 and through the control circuit 16 the shunt circuits 15 and the current detection circuits 14. In this case, the control circuit will generate pulse signals for at least the active current detection circuits 14 to cause these current detection circuits to shift their threshold into the operating range, and subsequently to sample the result of detection. This result is loaded into the scan chain circuit 17 and shifted out of the circuit for inspection.

Figure 3:
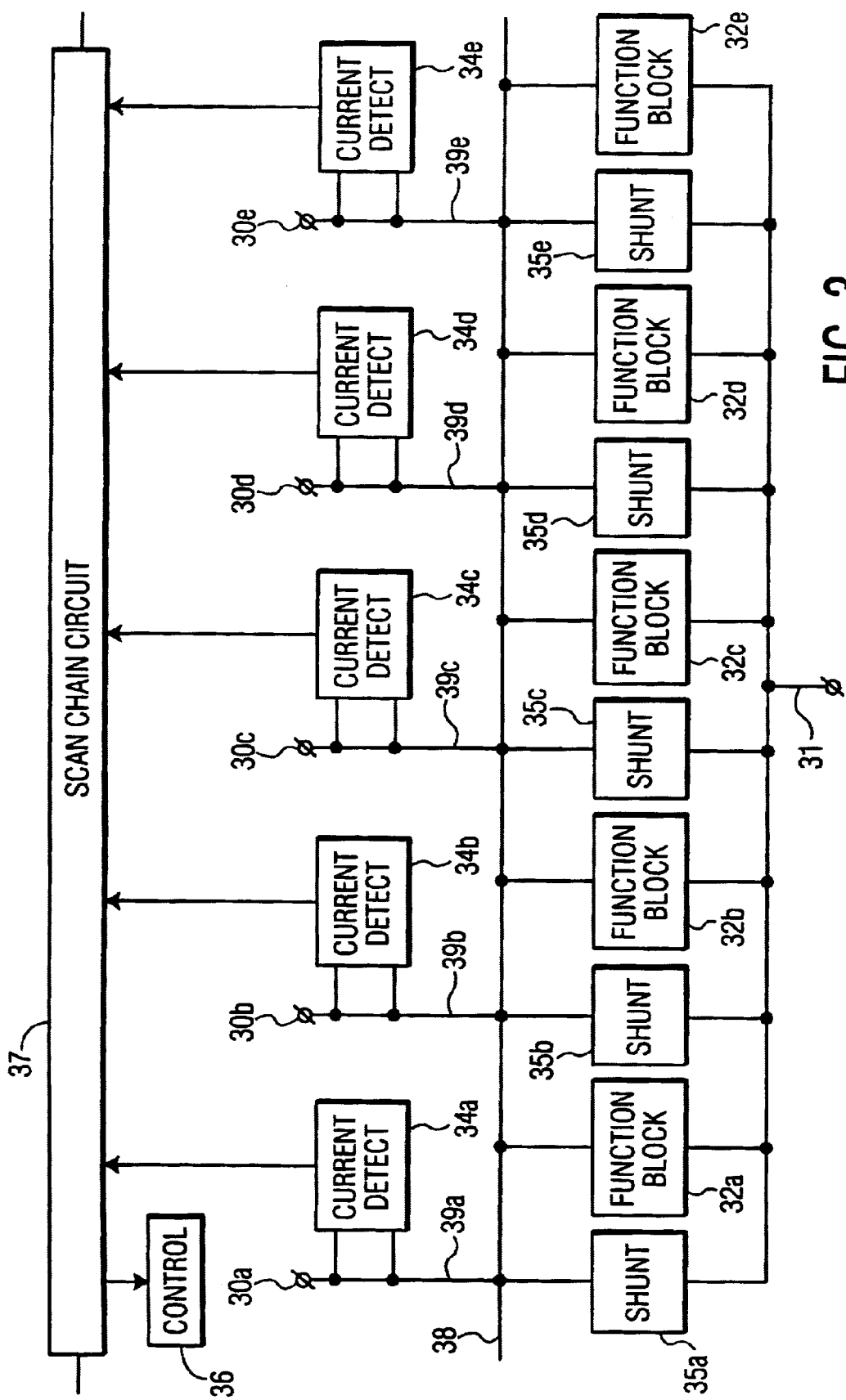
FIG. 3 shows a further circuit with a test interface.

FIG. 3 shows a further circuit with a test interface. This circuit has a number of first power supply terminals 30a–e, a second power supply terminal 31, a number of functional blocks 32a–e, a number of current detection circuits 34a–e, a number of shunt circuits 35a–e, a control circuit 36 and a scan chain circuit 37. Each of the power supply terminals 30a–e has its own connection 39a–e to a power supply conductor 38. The power supply conductor 38 is shown as a power supply ring, the ends of the power supply conductor 38 being connected together. Each of the current detection circuits 34a–e is connected at two points to a respective one of the connections 39a–e between the supply terminals 30a–e and the power supply conductor. Each functional block 32a–e is connected in parallel with a respective one of the shunt circuits 35a–e between the power supply conductor 38 and the second power supply terminal 31. The control circuit 36 has connections (not shown) to the various current detection circuits 34a–e and the shunt circuits 35a–e. The current detection circuits 34a–c have outputs coupled to the scan chain circuit.

Although only one connection to the second power supply terminal 31 has been shown for the sake of clarity, it will be understood that preferably multiple power supply terminals are also used for the second power supply terminal. The connections to these terminals may be tested in a way similar to the testing of the connections to the first power supply terminals 30a–e.

Each current detection circuit 34a–e is similar to the current detection circuit shown in FIG. 2 and can be controlled and read independent from the other current detection circuits. In principle the current detection circuits 34a–e can be activated in various combinations. Lu one combination, all current detection circuits 34a–e and all shunt circuits 35a–e are used simultaneously. Their thresholds are shifted in parallel and subsequently the currents through the connections detected while the shunt circuits are active. The sampled detection results are read out via the scan chain circuit 37. However, this requires that circuit to draw a lot of shunt current, which may lead to power problems.

In an alternative combination, one or a few of the connections 39a–e are tested at a time. For example, to test one connection 39a–e one may activate one shunt circuit 35a–e that is connected closest to that connection along the power supply conductor 38. This may be repeated subsequently for other connections 39a–e. This prevents problems with excessive power consumption due to simultaneous power dissipation by all shunt circuits 35a–e. However, under some circumstances this may not lead to the correct test result. For example, if other connections 39a–e than the one under test supply too much of the current to the one active shunt circuit 35a–e, the voltage drop along the connection 39a–e under test becomes less than the threshold even though supply current flows normally through the connection 39a–e under test.

In a preferred alternative, at least three of the shunt circuits 35a–e are activated when the current through one of the connections 39a–e is tested. A first one of the active shunt circuits 35a–e is the shunt circuit 35a–e that is electrically closest to the connection 39a–e under test (closest connection: the one that is separated from the connection 39a–e under test by the least resistance along the power supply conductor 38). Additional active shunt circuits 35a–e are at least a second and third shunt circuits 35a–e closest to the first one on either side along the power supply conductor 38 respectively. This ensures a sufficient voltage drop along the connection under test 39a–e when supply current flows normally through this connection, because this supply current also drains to the neighboring shunt circuits 35a–e. Further shunt circuits 35a–c close to the connection 39a–c under test (but less than all) may also be activated, so that no inactive shunt circuit 35a–e is electrically closer to the connection under test than any active shunt circuit 35a–e. Problems with excessive power dissipation are prevented because not all shunt circuits 35a–e are activated together. Because the inactive shunt circuits 35a–e are relatively further away from the connection under test (electrically speaking) activation of these inactive shunt circuits 35a–e would have relatively little effect on the current drained from the connection 39a–e under test.

Preferably, the test circuits for the connections 39a–e that are closest to the additional active shunt circuits 35a–e are self tested at the time when the connection 39a–e under test is tested. Thus, the self test is executed in near normal conditions with out requiring additional test time.

The scan chain circuit 37 may be used to control the selection of the shunt circuits 35a–e that are activated and the tests (no test, self test or real test) and, if necessary, the threshold shift introduced by the further controllable current source 25. To do so, string of binary zero's and ones is shifted into the scan chain circuit 37 and used to control the control circuit 36 and through the control circuit 36 the shunt circuits 35a–e and the current detection circuits 34a–e. In this case, the control circuit will generate pulse signals for at least the active current detection circuits 34a–e to cause these current detection circuits to shift their threshold into the operating range, and subsequently to sample the result of detection. Preferably, pulse signals are also generated for those shunt circuits 35a–e that should be activated according to the string in the scan chain circuit 37. In this embodiment, the tester must ensure that the appropriate shunt circuits 35a–e are activated when a specific current detection circuit 34a–e is activated.

In a first other embodiment, the control circuit 36 is arranged to select the shunt circuits 35a–e that are to be activated, dependent on the information from the scan chain circuit that indicates the current detection circuit 34a–e that is to be read. Using information about the connections of the shunt circuits 35a–e and current detection circuits 34a–e to the power supply conductor 38, it is straightforward which are the closest shunt circuit 35a–e and its nearest neighbors 35a–e and this can be used to program the control circuit 36.

In a further embodiment, the control circuit 36 is arranged to activate the current detection circuits 34a–e one after the other in response to a single command from the scan chain circuit 37. In this case, when each particular current detection circuit 34a–e is to be used, the control circuit 36 sends pulses to that particular current detection circuit 34a–e to cause it to shift its threshold into the operating range and subsequently to detect the current and to sample the result of detection. The control circuit 36 sends corresponding signals to the shunt circuit 35a–e closest to the particular current detection circuit 34a–e and the nearest neighbors of those shunt circuits 35a–e to make them conduct current during the detection of the current through the relevant connection 39a–e. In this embodiment, the sampled results from the various detection circuits 34a–e are loaded into the scan chain circuit 37 in parallel and shifted out serially for inspection. Optionally, self tests are also executed and combined with the results of current detection to prevent current from being signaled as correctly detected when in reality the current detection circuit 34a–e malfunctions. This can be done either by shifting out sampled self test results in addition to normal test results, or by logically combining self test results and normal test results.

What is claimed is:

1. Integrated circuit with a current test circuit, the integrated circuit comprising
  a supply pad;
  a functional block with a supply input;
  a conductive connection between the supply pad and the supply input;
  a current test circuit having test inputs coupled to a first and a second point along the conductive connection, for comparing a voltage across the test inputs with a threshold, the current test circuit comprising a threshold offset circuit for shifting the threshold to a shifted value dependent: on a voltage across the test inputs when the threshold offset circuit is active;
  wherein the current test circuit is connected to the threshold offset circuit, and the current test circuit provides for execution of a test command, the execution comprising at least the steps of making the threshold offset circuit active when a first voltage is applied across test inputs and comparing a second voltage at the test input with the shifted threshold, one of the first and second voltage being a voltage drop across the connection when the integrated circuit is set to draw current along said connection, the other one of the first and second voltage being a reference voltage.

2. The integrated circuit according to claim 1, comprising a switch for switching the threshold offset circuit, and when active, shifting the threshold to a level equal the voltage across the test inputs, and subsequently by a predetermined amount at least during said comparing.

3. The integrated circuit according to claim 2, the test interface being arranged to select the predetermined amount.

4. The integrated circuit according to claim 1, wherein the integrated circuit further comprises a timer.

5. The integrated circuit according to claim 1, comprising a switch network, for connecting the test inputs to a common node when the reference voltage is applied.

6. The integrated circuit according to claim 5, the switch network comprising a first, second, third and fourth transistor, a first one of the test inputs being coupled to the first point and to the common node via a main current channel of the first and second transistor respectively, a second one of the test inputs being coupled to the second point and the common node via a main current channel of the third and fourth transistor respectively, control electrodes of the second and fourth transistor being activated when the test inputs are connected to the common node, control electrodes of the first and third transistor being activated when the voltage drop is applied to the test inputs.

7. The integrated circuit according to claim 6, the current test circuit comprising
  a node;
  a first, second and third current supply circuit each with a current output coupled to the node, the first current supply circuit having a current control input coupled to a power supply connection;
  a comparator having an input coupled to the node and an output coupled to a test result output of the integrated circuit;
  a switch coupled between the node and a control input of the second current supply input;
  a control circuit arranged to make the switch conductive, whereby said threshold is shifted, to make the switch non-conductive during said comparing and to cause the third current supply circuit to change a current supplied to the node after making the switch non-conductive and before determining a detection result, whereby the threshold is offset by a predetermined amount from a level reached during shifting.

8. The integrated circuit according to claim 1 comprising a scan chain for entering test commands and reading test results, the scan chain being coupled to the threshold offset circuit and the current test circuit for, in response to a command to test a supply current successively activating and deactivating the threshold shifting circuit and sampling a result off detection of the current test circuit, the integrated circuit comprising a timing circuit for controlling timing of at least said deactivating autonomously, without requiring a further command from the scan chain.

9. The integrated circuit according to claim 1, the test interface being arranged to activate an output buffer of the functional block a predetermined time interval before said comparing or shifting, whichever involves applying said voltage drop to the test inputs, so as to start drawing current along said connection in order to apply the voltage drop to the test inputs.

10. The integrated circuit according to claim 1 comprising a switchable shunt circuit, a main current path of the shunt circuit being connected in parallel with the functional block so as to draw current from the supply pad via the conductive connection in parallel with the functional block, the test interface being arranged to maintain the shunt circuit in a non-conductive state during normal operation of the integrated circuit and to switch the shunt circuit into a conductive state at least when the integrated circuit is set to draw current along said connection in order to apply the voltage drop to the test inputs.

11. The integrated circuit according to claim 10, comprising a power supply conductor, the supply pad being one of a set of supply pads for a same power supply voltage, each supply pad being coupled to the power supply conductor via a respective testable conductive connection, the shunt circuit being one of a set of shunt circuits, each connected to the power supply conductor electrically closest to a respective conductive connection, the test interface being arranged to test each of the conductive connections by making that shunt circuit conduct that is connected to the power supply conductor electrically closest to a conductive connection under test, at least at a time when the integrated circuit is set to draw current along the conductive connection under test, the test interface being arranged to keep non-conductive at said time at least one of the set of shunt circuits that is connected to the power supply conductor electrically further away from the conductive connection under test than the electrically closest shunt circuit.

12. The integrated circuit according to claim 11, the test interface being arranged to make conductive at said time a subset of at least two shunt circuits that are all electrically closer to the conductive connection under test than any other one of the conductive connections, and to make non-conductive at said time the remaining ones of the set of shunt circuits.

13. The integrated circuit according to claim 12, comprising
a further current test circuit connected to a one of the conductive connections other than the conductive connection under test, the one of the conductive connections being connected to the power supply conductor electrically closer to one of the at least two shunt circuits than any one of the remaining ones of the shunt circuits, the further current test circuit being self testable, the test interface being arranged to cause a self test of the further current test when the at least two shunt circuits are made conductive.

14. Method of testing an integrated circuit, wherein the integrated circuit comprises a supply pad, a functional block and a conductive connection between the supply pad and the functional block; the integrated circuit comprising a current test circuit having test inputs coupled to the conductive connection for comparing a threshold with a voltage drop along said conductive connection due to a supply current from the supply pad to the functional block, the method comprising at least the steps of:
   comparing a threshold with a voltage drop along a said conductive connection due to a supply current from the supply pad to the functional block, and
   shifting the threshold dependent on a first voltage applied across test inputs and comparing a second voltage at a test input with a shifted threshold.

15. The method according to claim 14 wherein said voltage drop is induced by switching on an output buffer a predetermined time interval before said shifting or comparing, whichever involves applying said voltage drop to the test inputs.

* * * * *